United States Patent [19]

Gealer et al.

[11] Patent Number: 4,765,865
[45] Date of Patent: Aug. 23, 1988

[54] SILICON ETCH RATE ENHANCEMENT

[75] Inventors: Roy L. Gealer, West Bloomfield; Hans K. Karsten, Weidman, both of Mich.

[73] Assignee: Ford Motor Company, Dearborn, Mich.

[21] Appl. No.: 45,658

[22] Filed: May 4, 1987

[51] Int. Cl.$^4$ ............ H01L 21/306; B44C 1/22; C03C 25/06; C03C 15/00
[52] U.S. Cl. .................. 156/647; 156/657; 156/659.1; 156/661.1; 156/662; 204/129.65; 252/79.1; 252/79.5; 428/138; 428/450; 428/620; 437/228; 437/246
[58] Field of Search ............... 156/647–649, 156/657, 659.1, 661.1, 662; 252/79.1, 79.5; 428/131, 134, 138, 446, 450, 620; 204/129.65; 437/228, 245, 246

[56] References Cited

U.S. PATENT DOCUMENTS

| | | | |
|---|---|---|---|
| 3,012,920 | 12/1961 | Christensen et al. | 156/11 |
| 3,698,941 | 10/1972 | Nobel et al. | 156/662 X |
| 3,765,969 | 10/1973 | Kragness et al. | 156/647 |
| 3,785,892 | 1/1974 | Terry et al. | 156/3 |
| 3,947,304 | 3/1976 | Plauger | 156/648 X |
| 4,155,866 | 5/1979 | Berkenblit et al. | 252/79.1 |
| 4,189,342 | 2/1980 | Kock | 156/649 X |

OTHER PUBLICATIONS

A. Reisman et al. in "The Controlled Etching of Silicon in Catalyzed Ethylenediamine-Pyrocatechol-Water Solutions", *J. Electrochem. Soc.*: Solid-State Science and Technology, Aug. 1979, vol. 126, No. 8, pp. 1406–1415.

R. M. Finne et al. in "A Water-Amine-Complexing Agent System for Etching Silicon", *J. Electrochem. Soc.*: Solid State Science, Sep. 1967, vol. 14, No. 9, pp. 965–970.

K. Petersen in "Silicon as a Mechanical Material", *Proceedings of the IEEE*, May 1982, vol. 70, No. 5, pp. 420–457.

O. Glembocki et al. in "Bias-Dependent Etching of Silicon in Aqueous KOH", *J. Electrochem. Soc.*: Solid-State Science and Technology, Jan. 1985, vol. 132, No. 1, pp. 145–151.

Primary Examiner—William A. Powell
Attorney, Agent, or Firm—Lorraine S. Melotik; Roger L. May

[57] ABSTRACT

This invention is directed to a method for increasing the etch rate of a single crystal silicon wafer in an anisotropic etching solution. This method comprises applying a mask material to a portion of one face of the wafer and a metal coating to substantially the entire surface of an opposite face of the wafer which renders the electrode potential of the masked, metal coated single crystal silicon wafer more anodic than that of a masked, single crystal silicon wafer alone, and exposing the coated wafer to a suitable anisotropic etching solution. This method may further comprise applying an external anodic voltage to the masked, metal coated single crystal silicon wafer, which voltage is less than that which causes the electrode potential of the masked, metal coated single crystal silicon wafer to exceed the passivation potential of the masked, single crystal silicon wafer.

26 Claims, 2 Drawing Sheets

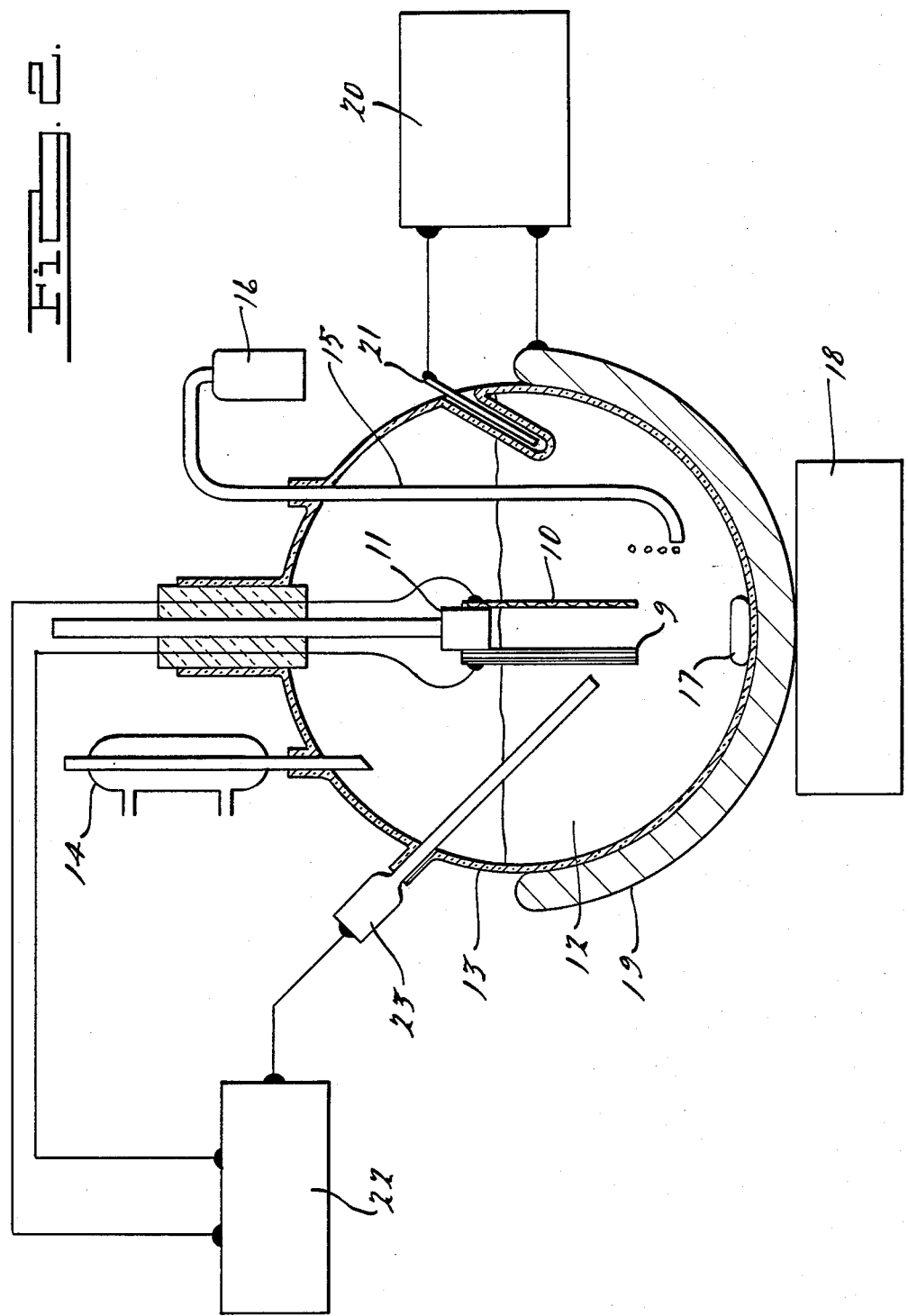

SILICON ETCH RATE ENHANCEMENT

TECHNICAL FIELD

This invention is directed to a method for increasing the etch rate of a masked face of a single crystal silicon wafer in an anisotropic etching solution.

BACKGROUND OF THE INVENTION

Miniature sensor devices can be micromachined in single crystal silicon (SCS) wafers using a variety of techniques common in the integrated circuit manufacturing industry. SCS is advantageously end extensively used in integrated circuits because, in addition to having the necessary electrical properties, it possesses high yield strength, elastic modulus, and fatigue strength. Still further, SCS allows for signal conditioning, amplifying, and control electronics to be fabricated on a single chip with a transducer. This last feature may lead to simplification and cost advantages in fabrication, assembly, and installation, and may also minimize signal loss, stray signals, and noise between the device and the circuitry due to connecting lead length. The silicon would be processed in the conventional manner for integrated circuit production, with the extra structural shape for the transducer being micromachined in after the electronic devices are incorporated.

Examples of transducer structures which may be micromachined from single crystal silicon are pressure sensor diaphragms (whose deflection, due to pressure differences, may be sensed by piezoresistive strain gauges diffused or implanted into the diaphragm surface or by capacitance changes between the diaphragm and the supporting structure), accelerometer cantilevers with diffused or implanted piezoresistors to sense deflection, and diaphragms or beams for thermal sensors, e.g., infrared thermopile detectors or thermal vacuum sensors.

Even though new micromachining techniques—and novel applications of old techniques—are now being continuously developed for producing such micromechanical structures, the most powerful and most versatile micromachining tool continues to be etching. Etching techniques for silicon include chemical, plasma, reactive-ion, and sputter etching. Chemical etchants for silicon are numerous. They can be isotropic or anisotropic, dope independent or not, and have varying degrees of selectivity to silicon, which determines the appropriate masking material. In order to micromachine silicon by chemical etching, the silicon is provided with a mask, such as photolithographically patterned silicon dioxide, and then the silicon is exposed to an etching solution, whereby the unmasked portion is etched. SCS wafers advantageously possess the ability to be anisotropically etched in depth with minimal lateral undercutting of the patterned mask. The thickness of the silicon product being formed by etching is controlled by regulating the time the silicon is left in the etchant, the etch rate of the etchant being known. Various approaches are known to increase the etch rate of the etching solution. For example, it has been shown by R. M. Finne and D. L. Klein in "A Water-Amine-Complexing Agent System for Etching Silicon", in *J. Electrochem. Soc.:* Solid State Science, September 1967, Vol. 14, No. 9, pgs. 965-970 that the etch rate of a commonly used etching solution comprising ethylenediamine, pyrocatechol, and water (EDP) varies with the water and pyrocathechol content. This reference teaches that the etch rate is also a function of the temperature of the etching solution, an increased temperature producing an accelerated etch rate. Still further, A. Reisman et al. teach in "The Controlled Etching of Silicon in Catalyzed Ethylenediamine-Pyrocatechol-Water Solutions", *J. Electrochem. Soc.:* Solid-State Science and Technology, August 1979, Vol. 126, No. 8, pgs. 1406-1415 that the etch rate in such etching solutions can be enhanced by the addition of trace quantities of 1,4- and 1,2-diazine. U.S. Pat. No. 4,155,866 to Berkenblit et al. is directed to that invention.

DISCLOSURE OF THE INVENTION

The present invention is directed to a method for etching a first face of a single crystal silicon wafer in an anisotropic etching solution. Opposite the first face (the face to be etched) is a second face. The method comprises: providing a mask material to a portion of the first face of the single crystal silicon wafer in a predetermined pattern which exposes a region of the first face to be etched; applying a metal coating to substantially the entire surface of the second face of the single crystal silicon wafer; and exposing the masked, metal coated single crystal silicon wafer to the anisotropic etching solution for a time necessary to etch, to a desired depth, the unmasked regions of the first face of the single crystal silicon wafer. The metal coating is (a) in electrical contact with the second face of the single crystal silicon wafer and (b) is selected from metals which (i) are substantially resistant to attack by the anisotropic etching solution and (ii) render the electrode potential of the masked, metal coated single crystal silicon wafer, in the anisotropic etching solution, more anodic than that of the masked, single crystal silicon wafer alone.

The metals are preferably selected from gold, silver, platinum, palladium, and nickel. The method may further comprise applying an external anodic voltage to the masked, metal coated single crystal silicon wafer, which voltage is less than that which causes the electrode potential of the masked, metal coated single crystal silicon wafer to exceed the passivation potential of the masked, single crystal silicon wafer, since beyond the passivation potential, wet chemical etching essentially stops. The external anodic potential may be applied to the metal coating on the second face or, when the mask is also a metal, to the mask. This invention is also directed to a single crystal silicon wafer modified by having a first face carry a mask material and a second face, opposite the first face, carry a metal coating as described above and to a method for making same.

Advantageously, in a given etching solution the etch rate of a single crystal silicon wafer, having a metal coating on the second face and an etch mask on the first face according to this invention, is increased to as much as four times or more the etch rate thereof without the metal coating on the second face. This etch rate can be increased even more by applying an anodic voltage to the masked, metal coated single crystal silicon wafer in the etching solution, as long as the voltage so applied is less than that which will cause the potential of the masked, metal coated single crystal silicon wafer to exceed the passivation potential of a masked, single crystal silicon wafer.

It is presently believed that the exposed silicon on one face (i.e., the first face) of the single crystal silicon wafer and the metal coating, e.g., gold, on the opposite face of the single crystal silicon wafer sets up a galvanic cell, whereby electrons are conducted from the silicon through the metal layer and an ionic current is conducted through the etching solution to an exposed region of the masked silicon surface to complete the circuit. The increased anodic potential provided the silicon by means of this metal coating on the second face causes increased dissolution of the silicon at the region of the first face which is not masked, thus increasing the etch rate of this unmasked portion. While such theory has been provided to explain the enhanced etching obtained according to the method of this invention, neither its understanding nor its validity is necessary for the practice of this invention.

BRIEF DESCRIPTION OF THE DRAWINGS

FIG. 2 is a schematic representation of an apparatus employed according to the method of this invention for applying an external anodic voltage to the masked, metal coated single crystal silicon wafer.

DETAILED DESCRIPTION OF THE INVENTION

Figure 1:
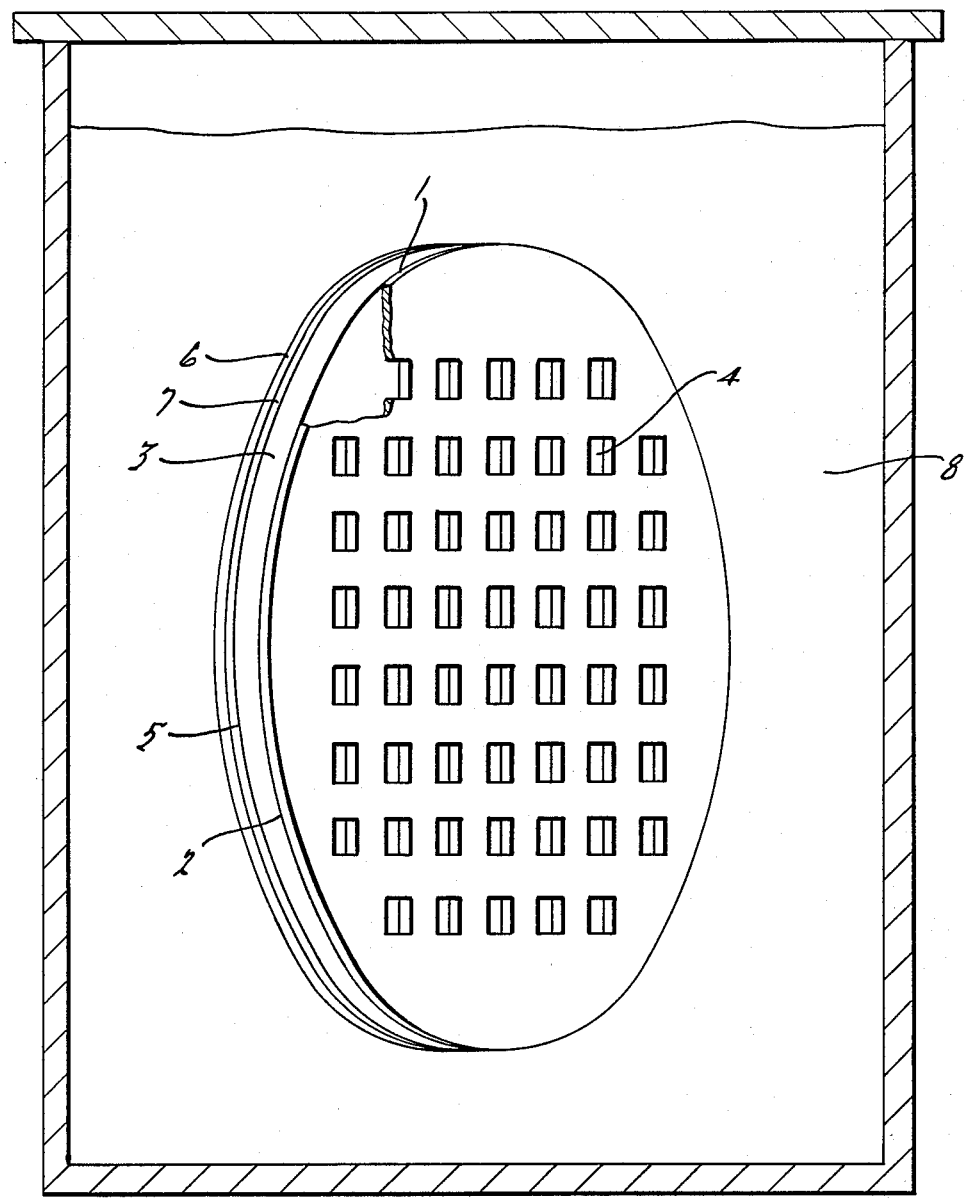
FIG. 1 is a schematic representation of a masked, metal coated single crystal silicon wafer according to this invention.

Wafers of single crystal silicon employed in the method of the present invention are readily available and well known to those skilled in the art. A wafer of single crystal silicon is generally a solid disk having two broad faces, i.e., the first and second faces, and a thin cylindrical edge. Additionally, the wafer employed in the method of the present invention may be a rectangular solid of single crystal silicon, having two broad faces, i.e., the first and second faces, and four thin edges. All features of the present invention apply if fragments or sections of a wafer are used instead of a complete wafer. The SCS employed in the method of the present invention is of the type and doping levels commonly used in the semi-conductor industry. Such silicon is thus p- or n-type doped silicon. Generally the SCS employed in the method of this invention has faces to be etched of (100) or (110) crystal orientation.

The method of the invention may be readily understood by referring to FIG. 1. The mask material (1) is provided to (i.e., grown on or applied to) the first face (2) of the silicon wafer (3) in a predetermined pattern. The mask is provided to a portion of the first face so as to leave a region (i.e., other portions) (4) of the first face exposed (i.e., the region is not masked). The (unmasked) region of the first face is etched when the silicon wafer is exposed to etching solution. Numerous masking materials are known and commerically available . As is known to those skilled in this art, the selection of masking material would be dependent, in part, on the etching solution being used. Commonly employed masking materials include silicon dioxide, silicon nitride ($Si_3N_4$), chromium and gold. The masking material may be provided in any of a number of ways including, for example, thermal oxidation of the silicon surface in oxygen and/or steam to form silicon dioxide (in such instance the mask is considered to be grown on the silicon), chemical vapor deposition of silicon dioxide from a gas mixture of silane and nitrous oxide or oxygen at elevated temperature, or chemical vapor deposition of silicon nitride from a gas mixture of silane, ammonia, and an inert gas at elevated temperature, with or without enhancement by a glow discharge plasma. Other suitable masking materials as well as methods for providing same, which may be employed in the present invention, will be apparent to those skilled in the art in view of the present disclosure.

On the second face (5) of the single crystal silicon wafer, which face is opposite the first face on which the mask is applied, is applied a coating of metal (6) so as to substantially cover the entire surface of the second face of the single crystal silicon wafer. The metal must be in electrical contact with the second face of the wafer and is selected from metals which (i) are substantially resistant to attack by the etching solution and which (ii) render the electrode potential of the masked, metal coated silicon wafer, in the etching solution, more anodic than that of the single crystal silicon wafer alone (in the etching solution). These metals include those selected from gold, silver, platinum, palladium, and nickel, with gold being most preferred. Between the second face of a single crystal silicon wafer and the metal coating thereon may be an interlayer (7) of an electrically conductive material which provides improved adhesion between the silicon wafer and the metal coating. Such an interlayer is preferably employed and comprises a material or mixture of materials selected, e.g., from chromium and titanium. Both the metal and the material of the interlayer may be deposited by methods selected from vacuum evaporation techniques, vacuum sputtering techniques, and electrodeposition techniques, which techniques are well known to those skilled in the art.

The etching solution (8) of the present invention comprises an anisotropic etching solution. As known to those skilled in the art, by means of an anisotropic etching solution the direction of etching is selectively controlled so as to produce etching of a silicon wafer in depth with minimal undercutting of the mask. Since the (111) planes of the SCS etch at a much slower rate than the (100) or (110) planes in anisotropic etchants, pattern mask undercutting is minimized by having the crystal orientation of the faces be (100) or (110)—then lateral etching is inhibited by exposure of (111) planes during etching.

Numerous anisotropic etching solutions are commercially available and known to those skilled in the art. Exemplary of such chemical etchants are aqueous sodium hydroxide, aqueous potassium hydroxide, tetramethyl ammonium hydroxide, aqueous phenols capable of etching silicon, aqueous amines capable of etching silicon, and compatible mixtures thereof. Suitable amines include ethylenediamine and hydrazine. One, particularly preferred anisotropic etching solution useful in the present invention comprises a mixture of ethylenediamine, pyrocatechol and water (EDP). Most preferrably, for use in the present invention, this anisotropic etching solution comprises the ethlenediamine, pyrocatechol, and water in a ratio of about 1 ml:0-0.06 g:0.08-2 ml. EDP has properties which make it advantageous for wet etching: it is anisotropic, making it possible to realize unique geometries not otherwise feasible, and it is highly selective and can be masked by a variety of materials, e.g., silicon dioxide, silicon nitride, chromium and gold. The EDP etchant may be used at temperatures ranging from 50° C. to the normal boiling point which, depending upon exact composition, is around 118° C. The preferred temperature is between 110° and 115° C. Oxygen must be excluded from an EPD etching solution to avoid reactions of the etchant solution with the oxygen. A solution of potassium hydroxide and water also effects orientation dependent etching and, in fact, exhibits much higher silicon crystal plane (110)-to-(111) etch rate ratios then EDP. For this reason, it is especially useful for groove etching on (110) silicon wafers since the large differential etch ratio permits deep, high aspect ratio grooves with minimal undercutting of the masks. A disadvantage of potassium hydroxide is that silicon dioxide is etched at a rate which precludes its use as a mask in many applications. For structures requiring long etching times, silicon nitride ($Si_3N_4$) is the preferred masking material for potassium hydroxide. As would be apparent to one skilled in the art in view of the present disclosure, numerous anisotropic etching solutions other than those mentioned may be employed in the present invention. During the etching of the silicon wafer of the present invention, the etching solution may be agitated. Generally, such agitation produces increased etching and a more clearly defined etched pattern.

As has been discussed above, it has also been found according to the method of the present invention that the etch rate can be further increased by applying a particular external anodic (i.e., positive) voltage to the masked, metal coated single crystal silicon wafer. One suitable system configuration in which to do this is shown in FIG. 2. The silicon wafer or fragment (9) (cross-section shown) is prepared as shown in FIG. 1. The silicon wafer and coatings and mask combination is mounted opposite a platinum gauze counter-electrode (10) (cross-section shown) in a holder (11) with the masked silicon face facing the counter-electrode, and the whole system is immersed in the etching solution (12). The pyrex reaction vessel (13) is equipped with a reflux condenser (14) to avoid loss of volatile solution components, a gas inlet (15) for introducing inert gas such as nitrogen or argon (16) to eliminate oxygen from the system, a magnetic stirring bar (17) rotated by a magnetic stirrer motor (18), a heating mantel (19) controlled by a thermostatic controller (20) and thermocouple (21). The voltage is supplied and the potential of the silicon wafer electrode is controlled and measured by a potentiostat-potentiometer (22) at the desired fixed value relative to a calomel reference electrode (23). The reference electrode is filled with saturated potassium chloride electrolyte (saturated calomel electrode or SCE). If a metal is used as a mask material on the first face, this external voltage may be applied either to this metal mask on the first face or to the metal coating on the second face. The etch rate increases with voltage as long as the voltage is less than that which causes the electrode potential of the masked, metal coated silicon wafer to exceed the passivation potential of the silicon. Beyond the passivation potential silicon etching stops or essentially stops. The passivation potential can be determined by slowly increasing the voltage applied while monitoring the (increasing) current flow. When the passivation potential is reached, current flow generally reaches a maxmimum and falls off rapidly to a very low value as voltage continues to increase.

The invention will be further understood by referring to the following detailed examples. It should be understood that the specific examples are presented by way of illustration and not by way of limitation.

EXAMPLES

EXAMPLE 1a

A (100)-oriented, single crystal, n-doped, 1.5 ohm cm resistivity silicon wafer is provided on one face with a 1 micrometer thick thermal silicon dioxide mask having square openings for etching square cavities, and on the opposite face with a 1 micrometer thick thermal silicon dioxide layer with no mask openings. The wafer is immersed in a nitrogen-blanketed etching solution of ethylenediamine, pyrocatechol, and water in the ratio 1 ml:0.16 g:0.32 ml at 110° C. The total depth of cavity etched in the silicon exposed through the mask on the first face at several locations averages 11.3 micrometers after 30 minutes and 11.7 micrometers after 30 minutes in duplicate experiments for an average etch rate of approximately 0.38 micrometers per minute.

EXAMPLE 1b

A wafer as in Example 1a is prepared on one face with a 1 micrometer thick thermal silicon dioxide mask having square openings for etching square cavities, and on the opposite face with a 0.07 micrometer thick coating of vacuum deposited chromium followed by a 0.1 micrometer thick coating of vacuum deposited gold. The wafer is immersed in an etching solution as in Example 1a at 110° C. The electrode potential of the silicon-gold combination is −1.37 volts vs. SCE with no external voltage applied, compared to −1.54 volts vs. SCE for plain silicon. (As would be apparent to those skilled in the art, a potential of −1.37 volts is relatively more anodic than a potential of −1.54 volts. The electrode potential of plain silicon is determined by applying a gold coating to one face of the silicon to provide a conductive path to the potentiometer, and insulating it from the solution with a coating of silicone rubber to avoid the influence of the gold on the electrode potential.) With the gold exposed, the total depth of cavity etched in the silicon exposed through the mask on the first face at several locations averages 51.6 micrometers after 30 minutes and 41.0 micrometers after 30 minutes in duplicate experiments for an average etch rate of 1.54 micrometers per minute.

EXAMPLE 1c

A wafer as in Example 1a is prepared with a silicon dioxide mask on one face and metal coating on the opposite face as in Example 1b, and the wafer is immersed in an etching solution as in Example 1a at 110° C. A voltage is applied to the metal coating such that the potential of the wafer is −0.95 volts vs. SCE. The total depth of cavity etched in the silicon exposed through the mask on the first face at several locations averages 67.0 micrometers after 30 minutes for an average etch rate of 2.23 micrometers per minute.

EXAMPLE 2a

A (100)-oriented, single crystal, p-doped, 43.8 ohm cm resistivity silicon wafer is prepared with a silicon dioxide mask on one face and a continuous silicon dioxide layer on the opposite face as in Example 1a. The wafer is immersed in an etching solution as in Example 1a at 110° C. The total depth of cavity etched in the silicon exposed through the mask on the first face at several locations averages 11.3 micrometers after 30 minutes, 43.5 micrometers after 100 minutes, and 11.8 micrometers after 30 minutes in triplicate experiments for an average etch rate of 0.40 micrometers per minute.

EXAMPLE 2b

A wafer as in Example 2a is prepared with a silicon dioxide mask on one face and metal coating on the opposite face as in Example 1b. The wafer is immersed in an etching solution as in Example 1a at 110° C. The electrode potential of the silicon-gold combination is −1.23 volts vs. SCE with no external voltage applied, compared to −1.46 volts vs. SCE for silicon. The total depth of cavity etched in the silicon exposed through the mask on the first face at several locations averages 31.2 micrometers after 30 minutes for an average etch rate of 1.04 micrometers per minute.

EXAMPLE 2c

A wafer as in Example 2a is prepared with a silicon dioxide mask on one face and metal coating on the opposite face as in Example 1b, and the wafer is immersed in an etching solution as in Example 1a at 110° C. A voltage is applied to the metal coating such that the potential of the wafer is −0.75 volts vs. SCE. The total depth of cavity etched in the silicon exposed through the mask on the first face at several locations averages 76.0 micrometers after 30 minutes for an average etch rate of 2.53 micrometers per minute.

EXAMPLE 3

A (110)-oriented, single crystal, n-doped, 5 ohm cm resistivity silicon wafer is prepared on one face with a 0.7 micrometer thick plasma deposited silicon nitride mask having rectangular openings for etching rectangular cavities, and on the opposite face with a 0.7 micrometer thick plasma deposited silicon nitride layer with no mask openings. A second equivalent wafer is prepared on one face with a 0.7 micrometer thick plasma deposited silicon nitride mask having rectangular openings for etching rectangular cavities, and on the opposite face with a 0.05 micrometer thick coating of sputter deposited titanium followed by a 0.08 micrometer thick coating of sputter deposited platinum. The wafers are immersed in a solution of ethylenediamine, pyrocatechol, and water in the ratio 1 ml:0.24 g:0.25 ml at 115° C. The wafer with the platinum coated back face etches at a faster rate through the mask on the first face than does the wafer with no platinum coating.

EXAMPLE 4

Two wafers as in Example 3 are prepared as in Example 3. The wafers are immersed in a solution of hydrazine and water in the ratio 1 ml hydrazine:1 ml water at 90° C. The wafer with the platinum coated back face etches at a faster rate through the mask on the first face than does the wafer with no platinum coating.

In view of the disclosure, many modifications of this invention will be apparent to those skilled in the art. It is intended that all such modifications which fall within the true scope of this invention be included within the terms of the appended claims.

We claim:

1. A method for etching a first face of a single crystal silicon wafer in an anisotropic etching solution, said wafer having a second face opposite said first face, which method comprises:
   providing a mask material to a portion of said first face of said single crystal silicon wafer in a predetermined pattern which exposes a region of said first face to be etched;
   applying a metal coating to substantially the entire surface of said second face of said single crystal silicon wafer, said metal coating being (a) in electrical contact with said second face of said crystal silicon wafer and (b) selected from metals which (i) are substantially resistant to attack by said anisotropic etching solution and (ii) render the electrode potential of the masked, metal coated single crystal silicon wafer, in said anisotropic etching solution, more anodic than that of said masked, single crystal silicon wafer alone; and
   exposing said masked, metal coated single crystal silicon wafer to said anisotropic etching solution for a time necessary to etch, to a desired depth, said region of said first face of said masked, metal coated single crystal silicon wafer.

2. A method according to claim 1, wherein said metals are selected from gold, silver, platinum, palladium and nickel.

3. A method according to claim 1, wherein said mask material is selected from silicon dioxide, silicon nitride, chromium and gold.

4. A method according to claim 1, wherein said anisotropic etching solution is selected from aqueous sodium hydroxide, squeous potassium hydroxide, tetramethyl ammonium hydroxide, aqueous phenols capable of etching silicon, aqueous amines capable of etching silicon, and compatible mixtures thereof.

5. A method according to claim 4, wherein said amines are selected from ethylenediamine and hydrazine.

6. A method according to claim 5, wherein said anisotropic etching solution comprises ethylenediamine, pyrocatechol, and water in a ratio of about 1 ml:0–0.06 g:0.08–2 ml.

7. A method according to claim 1, wherein said metal coating is applied to said second face of said single crystal silicon wafer by methods selected from vacuum evaporation techniques, vacuum sputtering techniques, and electrodeposition techniques.

8. A method according to claim 1, which further comprises applying an interlayer between said second face of said single crystal silicon wafer and said metal coating, said interlayer being an electrically conductive material providing adhesion between said second face of said silicon wafer and said metal coating.

9. A method according to claim 8, wherein said interlayer material is selected from chromium and titanium.

10. A method according to claim 8, wherein said interlayer material and said metal coating are applied to said second face of said single crystal silicon wafer by methods independently selected from vacuum evaporation techniques, vacuum sputtering techniques, and electrodeposition techniques.

11. A method according to claim 1, which further comprises applying an external anodic voltage to said masked, metal coated single crystal silicon wafer, said voltage being less than that which causes the electrode potential of said masked, metal coated single crystal silicon wafer to exceed the passivation potential of a masked, single crystal silicon wafer.

12. A method acording to claim 11, wherein said external voltage is applied to said metal coating on said second face of said masked, metal coated single crystal silicon wafer.

13. A masked, metal coated single crystal silicon wafer having a first face adapted for etching in an anisotropic etching solution, said silicon wafer comprising:
   a first face having a non-metal mask material on a portion thereon in a predetermined pattern which exposes a region of said first face to be etched; and
   a second face, opposite said first face, having a metal coating which (a) is in electrical contact with and (b) coats substantially the entire surface of said second face of said single crystal silicon wafer, said coating being selected from metals which (i) are substantially resistant to attack by said anisotropic etching solution and (ii) render the electrode potential of the masked, metal coated single crystal silicon wafer, in said anisotropic etching solution, more anodic than that of a masked, single crystal silicon wafer alone.

14. A silicon wafer according to claim 13, wherein said metals are selected from gold, silver, latinum, palladium, and nickel.

15. A silicon wafer according to claim 13, wherein said non-metal mask material is selected from silicon dioxide and silicon nitride.

16. A silicon wafer according to claim 13, which further comprises an interlayer between said second face of said single crystal silicon wafer and said metal coating, said interlayer being an electrically conductive material providing adhesion between said second face of said single crystal silicon wafer and said metal coating.

17. A silicon wafer according to claim 13, wherein said interlayer material is selected from chromium and titanium.

18. A method for forming a single crystal silicon wafer having a first face being adapted for etching in an anisotropic etching solution, which method comprises:
providing a non-metal mask material to a portion of said first face of said single crystal silicon wafer in a predetermined pattern which exposes a region of said first face to be etched; and
applying a coating of metal to substantially the entire surface of a second face which is opposite said first face of said single crystal silicon wafer, said metal coating being (a) in electrical contact with said second face of said single crystal silicon wafer and (b) selected from metals which (i) are resistant to attack by said anisotropic etching solution and (ii) render the electrode potential of the masked, metal coated single crystal silicon wafer, in said anisotropic etching solution, more anodic than that of a masked single crystal silicone wafer alone.

19. A method according to claim 18, wherein said metals are selected from gold, silver, platinum, palladium, and nickel.

20. A method according to claim 18, wherein said non-metal mask material is selected from silicon dioxide and silicon nitride.

21. A method according to claim 18, wherein said metal is applied to said second face of said single crystal silicon wafer by methods selected from vacuum evaporation techniques, vacuum sputtering techniques, and electrodeposition techniques.

22. A method according to claim 18, which further comprises applying an interlayer between said second face of said single crystal silicon wafer and said metal coating, said interlayer being an electrically conductive material providing adhesion between said second face of said single crystal silicon wafer and said metal coating.

23. A method according to claim 22, wherein said material comprising said interlayer is selected from chromium and titanium.

24. A method according to claim 22, wherein said interlayer material and said metal coating are applied to said second face of said single crystal silicon wafer by methods independently selected from vacuum evaporation techniques, vacuum sputtering techniques, and electrodeposition techniques.

25. A method for etching a first face of a single crystal silicon wafer in an anisotropic etching solution, said method comprising:
exposing a masked, metal coated single crystal silicon wafer to said anisotropic etching solution for a time necessary to etch, to a desired depth, a region of said first face of said masked, metal coated single crystal silicon wafer, said silicon wafer comprising:
said first face carrying a mask material on a portion thereon in a predetermined pattern which exposes a region of said first face to be etched; and
a second face, opposite said first face, carrying a metal coating which (a) is in electrical contact with and (b) coats substantially the entire surface of said second face of said single crystal silicon wafer, said coating being selected from metals which (i) are substantially resistant to attack by said anisotropic etching solution and (ii) render the electrode potential of the masked, metal coated single crystal silicon wafer, in said anisotropic etching solution, more anodic than that of a masked, single crystal silicon wafer alone.

26. A method according to claim 25, which further comprises applying an external anodic voltage to said masked, metal coated single crystal silicon wafer, said voltage being less than that which causes the electrode potential of said masked, metal coated single crystal silicon wafer to exceed the passivation potential of a masked, single crystal silicon wafer.

* * * * *